(12) United States Patent
Lu et al.

(10) Patent No.: US 6,682,039 B2
(45) Date of Patent: Jan. 27, 2004

(54) LOCATOR FOR A MATERIAL SHEET

(75) Inventors: Tsung-Lin Lu, Tainan Hsien (TW); Ta-Shuang Kuan, Hsinchu Hsien (TW)

(73) Assignee: Unipac Optoelectronics Corporation, Hsinchu (TW)

( * ) Notice: Subject to any disclaimer, the term of this patent is extended or adjusted under 35 U.S.C. 154(b) by 0 days.

(21) Appl. No.: 09/867,409

(22) Filed: May 31, 2001

(65) Prior Publication Data

US 2002/0139914 A1 Oct. 3, 2002

(30) Foreign Application Priority Data

Mar. 29, 2001 (TW) ..................................... 90204863 U

(51) Int. Cl.$^7$ ............................................. A47B 91/00
(52) U.S. Cl. ............................. 248/346.03; 248/346.01
(58) Field of Search ....................... 248/346.01, 346.04, 248/346.03, 176.1, 505, 500, 201, 346.06, 346.07; 211/41.17; 451/364, 365; 361/600; 269/287, 900, 293, 364, 365, 289 R

(56) References Cited

U.S. PATENT DOCUMENTS

| | | | | |
|---|---|---|---|---|
| 4,458,874 A | * | 7/1984 | Rabas et al. | 248/670 |
| 5,195,729 A | * | 3/1993 | Thomas et al. | 269/21 |
| 5,510,956 A | * | 4/1996 | Suzuki | 361/704 |
| 5,622,590 A | * | 4/1997 | Kunitomo et al. | 156/291 |
| 5,984,255 A | * | 11/1999 | Reyes | 248/694 |
| 6,300,686 B1 | * | 10/2001 | Hirano et al. | 257/783 |
| 6,343,784 B1 | * | 2/2002 | Jourde et al. | 269/287 |
| 6,398,900 B1 | * | 6/2002 | Hieda et al. | 156/245 |

* cited by examiner

*Primary Examiner*—Gwendolyn Baxter
(74) *Attorney, Agent, or Firm*—Troxell Law Office PLLC

(57) ABSTRACT

A locator for a material sheet comprises at least two oppositely disposed stoppers, and a slot sheet. Each of the stoppers provides a flat bearing surface and a slant surface extending outward and upward from the bearing surface with a junction between them. The slot sheet is disposed under the stoppers and joining to a bottom of the respective stopper. The distance between the junctions on the two stoppers is corresponding to the length of the slot sheet.

1 Claim, 2 Drawing Sheets

LOCATOR FOR A MATERIAL SHEET

BACKGROUND OF THE INVENTION

1. Field of the Invention

The present invention relates to a locator for a material sheet, and particularly to a locator for confining a distance between two end parts of a material sheet effectively.

2. Description of Related Art

Normally, aligning or correcting the position of a material sheet such as a glass substrate, a sheet of chip, or the like in a load-lock chamber and a heat chamber during the operation of plasma enhanced chemical vapor deposition is performed by way of two opposite stoppers disposed at two lateral sides of the material sheet. There is no doubt that the two lateral sides of the material sheet can be confined properly at both lateral sides thereof simply by way of these two opposite stoppers and can reach an expected effect. However, the positions at both ends of the material sheet are not possible to be located positively and especially it is impossible to prevent from the slide deviation effectively.

The preceding way for locating the material sheet makes the position of the glass substrate or the chip sheet prior to enter the process chamber different from the calibrated position of the robot. Thus, the film is unable to deposit at a right position during the operation of film depositing, that is, a phenomenon of the so-called film shift may occur.

The film shift may result in incomplete plating at the edge of the material sheet, and even more, the film is plated to exceed the boundary of the sheet. Also, it can occur not only a phenomenon of non-uniform film thickness on the surface of the sheet caused by a change of air current but also a phenomenon of arcing to influence the life span of component parts thereof.

Furthermore, the material sheet may elongate forward and backward due to error resulting from fabricating, delivering, thermal expansion, or other reasons. Especially, it is noted that heating is one of required steps for the operation of plasma enhanced chemical vapor deposition. Hence, the locator with regard to lateral positioning is not possible to prevent the material sheet from the deformation of both end parts thereof.

SUMMARY OF THE INVENTION

An object of present invention is to provide a locator for a material sheet, in which opposite stoppers being disposed at front and rear ends of the material sheet corresponding the length of the slot sheet for confining a distance between two end parts of a sheet effectively.

BRIEF DESCRIPTION OF THE DRAWINGS

The present invention can be more fully understood by referring to the following description and accompanying drawings, in which.

DETAILED DESCRIPTION OF THE PREFERRED EMBODIMENTS

Figure 1:
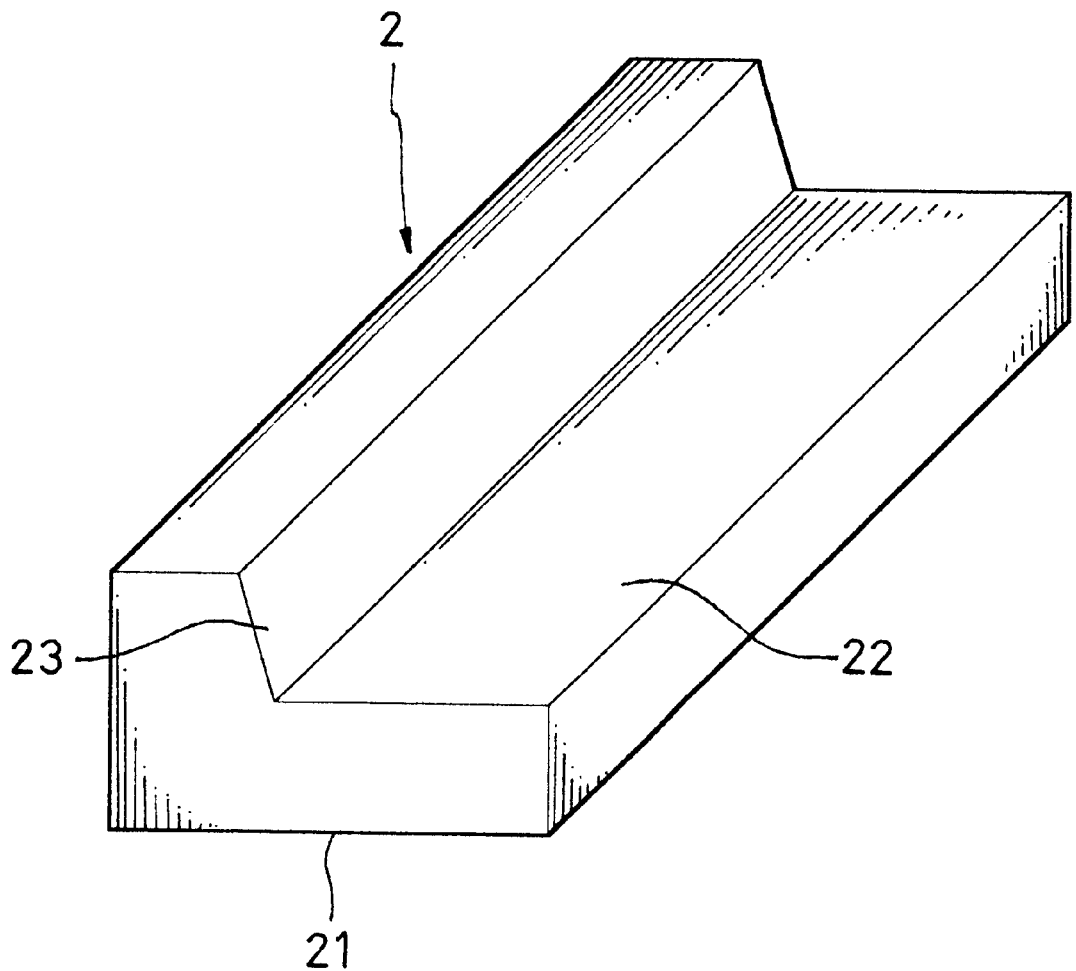
FIG. 1 is a perspective view of a stopper according to the present invention.
Figure 2:
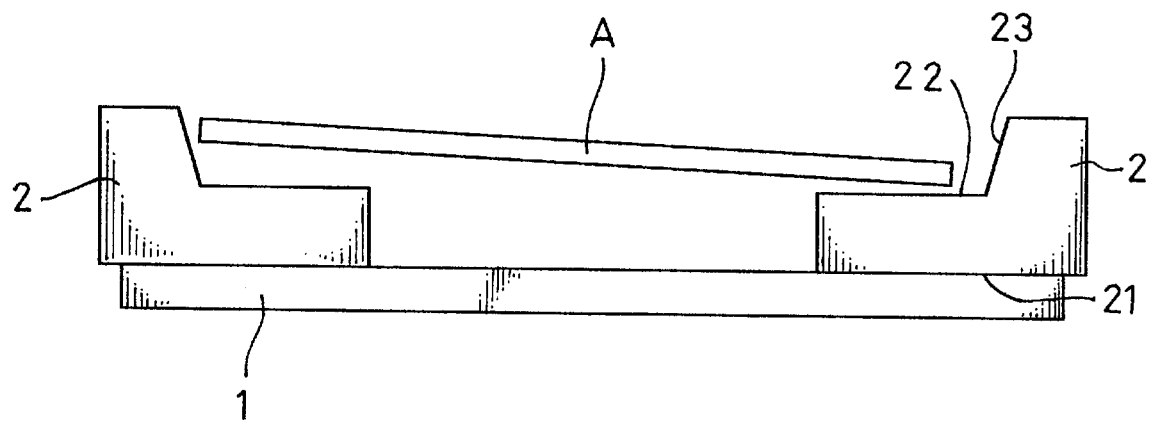
FIG. 2 is a side view illustrating a glass substrate being placed on a slot sheet with the stoppers of the present invention.
Figure 3:
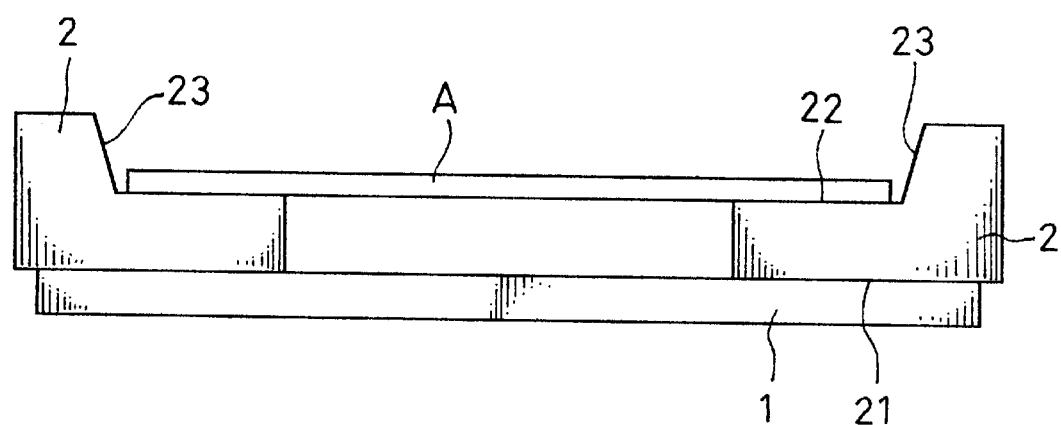
FIG. 3 is a side view illustrating the glass substrate having been located by way of the stoppers of the present invention.

Referring to FIGS. 1 through 3, the locator of present invention used in the preceding load-lock chamber/or heat chamber comprises a slot sheet 1, and at least a stopper 2 at both ends of the slot sheet 1 respectively.

Wherein, the slot sheet 1 is conventional and can be a sheet provided in the load-lock chamber or a sheet provided in the heat chamber so that a flat plane is provided on the slot sheet 1 with both lateral sides thereof having a stopper or a guard frame to confine a left and a right positions of a glass substrate sheet.

The crux of the present invention resides in that the slot sheet 1 at the front and the rear ends thereof joins at least a stopper 2 for locating the front and rear ends of the substrate sheet respectively. As shown in FIG. 1, the stopper 2 is solid with a bottom surface 21 to be joined to an end surface of the slot sheet 1 by way of a mechanical or a chemical mode such as threaded fastening, clamping, adhering, and etc. These modes are belonged to prior art and no detail will be described further.

The stopper 2 at the upper surface thereof has a bearing surface 22 for the substrate sheet "A" being disposed horizontally. Hence, the bearing surface 22 is provided with an elevation equal to the height of supports at the lateral sides thereof.

In order to perform the locating job and confine the distance between the front and the rear ends of the substrate sheet "A", the stopper 2 at the bearing surface 22 thereof extends outward a slant surface 23 for the substrate sheet "A" being able to slide downward. Hence, the distance between the respective slant surface 22 with the bearing surface 22 thereof on the two stoppers 2 is not less than the length of the substrate sheet "A".

Referring to FIG. 2, while the substrate sheet "A" is being put in place from the top of the locator, one of the front and the rear ends thereof touches and slides downward along the slant surface 23 on one of the two opposite stoppers 2 such that the substrate 2 may move toward the other stopper 2 to allow both ends thereof in contact with the respective bearing surface 22 on both stoppers 2 in a state of being located in addition to the both lateral sides thereof having been located. In this way, the disposed substrate sheet "A" can be confined completely and be placed at a preset position.

In practice, it is better if a stopper 2 is arranged at both ends of the slot sheet 1 respectively, the stopper 2 can be placed at a middle position of each of opposite ends on the slot sheet 1 for a consideration of equilibrium. In case of two or more stoppers 2 are provided at both ends of the substrate sheet A respectively, a gap between any two adjacent stoppers is preferably equidistantly spaced apart.

It is appreciated that the present invention can prevent a sheet material from sliding so as to solve the long time problem with regard to improper locating effectively. Moreover, the present invention can resist an undesirable phenomenon cause by the work piece extending forward and backward due to the thermal expansion under working such as heating after completing the locating job so as to promote the quality of work piece and fraction of goodness.

While the invention has been described with reference to a preferred embodiment thereof, it is to be understood that modifications or variations may be easily made without departing from the spirit of this invention, which is defined by the appended claims.

What is claimed is:

1. A locator for locating a material sheet while performing a manufacturing process thereon, and comprising:

a) a planar slot sheet having an upper surface with opposite ends; and, b) a plurality of spaced apart stoppers mounted on the opposite ends of upper surface of the slot sheet, each stopper having a bottom surface engaging the upper surface and extending beyond one of the opposite ends of the slot sheet, a horizontal bearing surface and a slanted surface extending upwardly from the horizontal bearing surface, the slanted surface extending along an entire length of the horizontal surface, wherein a distance between the slanted surfaces increases in a direction away from the horizontal bearing surfaces and wherein the horizontal bearing surfaces are located so as to support a material sheet in a predetermined location with an upper surface exposed.

* * * * *